United States Patent
Lin et al.

(10) Patent No.: US 12,382,608 B2
(45) Date of Patent: Aug. 5, 2025

(54) IMMERSION COOLING DEVICE AND ELECTRONIC MODULE HAVING THE SAME

(71) Applicant: Fulian Precision Electronics (Tianjin) Co., LTD., Tianjin (CN)

(72) Inventors: Chun-Wei Lin, New Taipei (TW); Tsung-Lin Liu, Neihu (TW); Yu-Chia Ting, Neihu (TW); Chia-Nan Pai, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 194 days.

(21) Appl. No.: 18/221,432

(22) Filed: Jul. 13, 2023

(65) Prior Publication Data
US 2024/0381573 A1    Nov. 14, 2024

(30) Foreign Application Priority Data
May 11, 2023    (CN) .......................... 202321129409.4

(51) Int. Cl.
*H05K 7/20*    (2006.01)

(52) U.S. Cl.
CPC ............. *H05K 7/203* (2013.01); *H05K 7/208* (2013.01)

(58) Field of Classification Search
CPC .... H05K 7/203; H05K 7/208; H05K 7/20818; H01L 23/44
See application file for complete search history.

(56) References Cited

U.S. PATENT DOCUMENTS

| | | | |
|---|---|---|---|
| 11,096,306 B1* | 8/2021 | Xu ............................. | G06F 1/20 |
| 2014/0218858 A1* | 8/2014 | Shelnutt ................. | H05K 7/203 |
| | | | 361/679.31 |
| 2016/0345461 A1* | 11/2016 | Smith ..................... | H05K 7/203 |
| 2022/0264768 A1* | 8/2022 | Horng ................. | H05K 7/20327 |
| 2024/0015930 A1* | 1/2024 | Tu ....................... | H05K 7/20318 |

FOREIGN PATENT DOCUMENTS

WO    WO-2021190403 A1 *    9/2021

OTHER PUBLICATIONS

WO-2021190403-A1 Translation (Year: 2021).*

* cited by examiner

*Primary Examiner* — David J Teitelbaum
(74) *Attorney, Agent, or Firm* — ScienBiziP, P.C.

(57) ABSTRACT

An immersion cooling device includes a housing defining a chamber, a working liquid received in the chamber, a condenser received in the chamber and located outside the working liquid, and at least one support plate received in the chamber. Each of the at least one support plate includes a first portion and a second portion connected to the first portion. The first portion is immersed in the working liquid and configured to hold an electronic device. The second portion protrudes from the working liquid. The second portion defines a slot extending through the second portion, and an opening of the slot faces the condenser.

16 Claims, 3 Drawing Sheets

IMMERSION COOLING DEVICE AND ELECTRONIC MODULE HAVING THE SAME

FIELD

The subject matter herein generally relates to heat dissipation, and more particularly, to an immersion cooling device and an electronic module having the immersion cooling device.

BACKGROUND

Electronic devices, such as servers, may generate heat during working. In order to dissipate the heat generated by the server, the server is mounted to a support plate and then immersed in coolant, and such coolant includes a non-conductive mineral oil that has a low activity. The coolant absorbs the heat generated by the server and vaporizes to dissipate the heat. The vaporized coolant then liquefies and condenses when it encounters the condenser. However, during the above cooling process, the vaporized coolant needs to bypass the top of the support plate before reaching the condenser, which affects the cooling efficiency. Therefore, there is room for improvement in the art.

BRIEF DESCRIPTION OF THE DRAWINGS

Implementations of the present technology will now be described, by way of embodiment, with reference to the attached figures.

DETAILED DESCRIPTION

Figure 1:
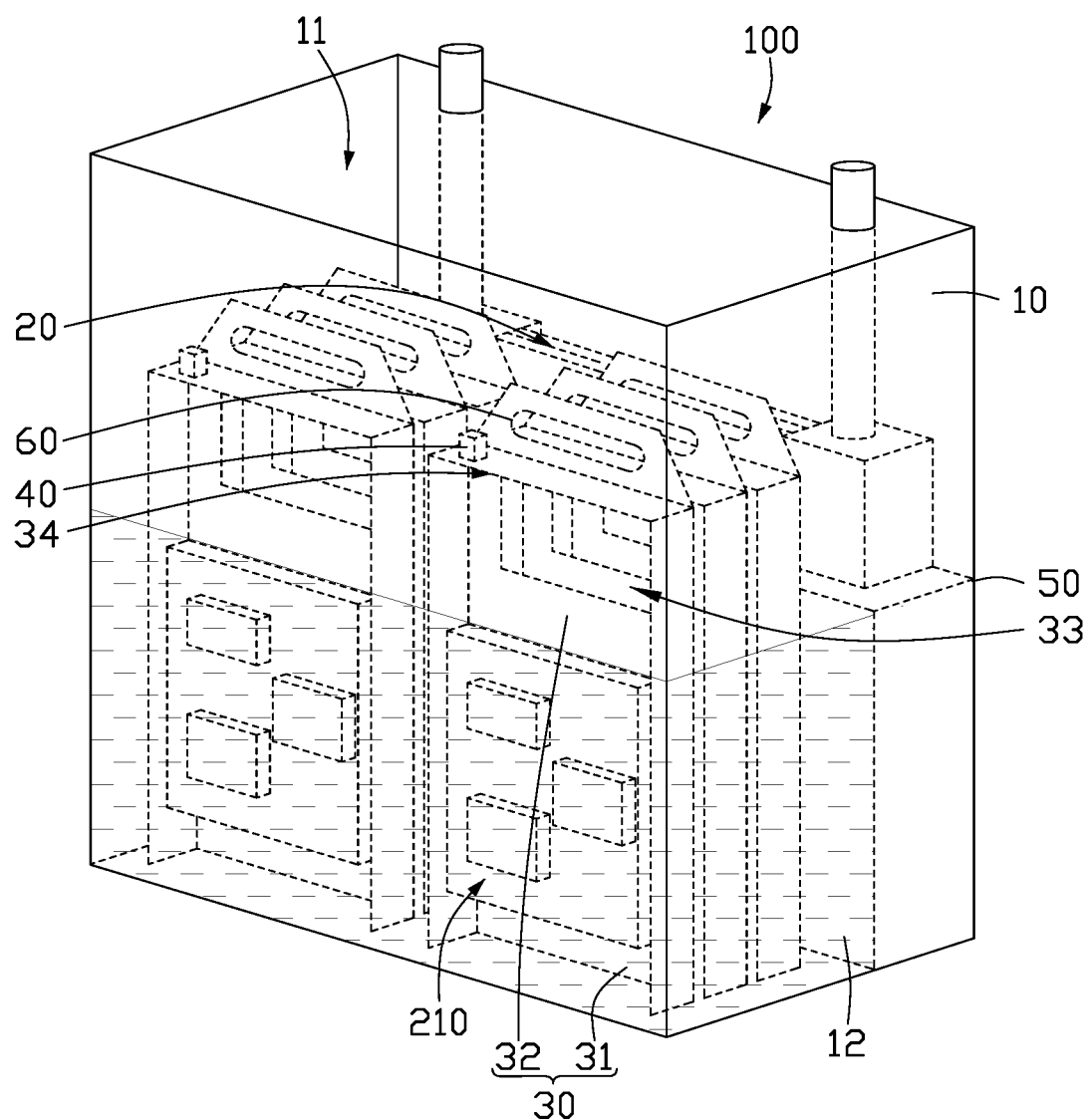
FIG. 1 is a perspective view of an electronic module according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
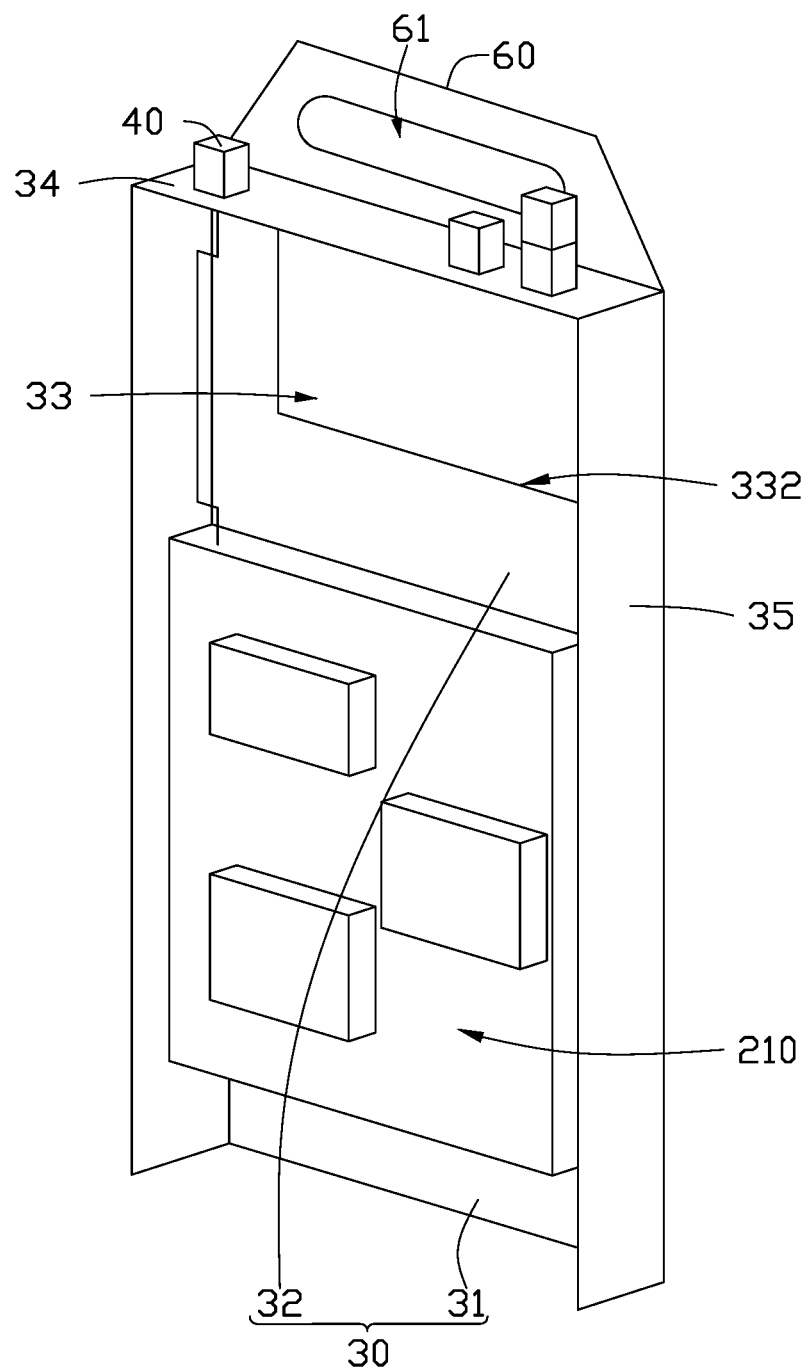
FIG. 2 is a perspective view of a support plate and an electronic device of the electronic module of FIG. 1.

Referring to FIGS. 1 and 2, an electronic module 200 is provided according to an embodiment of the present disclosure. The electronic module 200 includes an electronic device 210 and an immersion cooling device 100. The electronic device 210 is disposed in the immersion cooling device 100, and the immersion cooling device 100 can dissipate heat generated by the electronic device 210. The electronic device 210 may be a server, a resistor wire, or another electronic component that generates heat during working.

Figure 3:
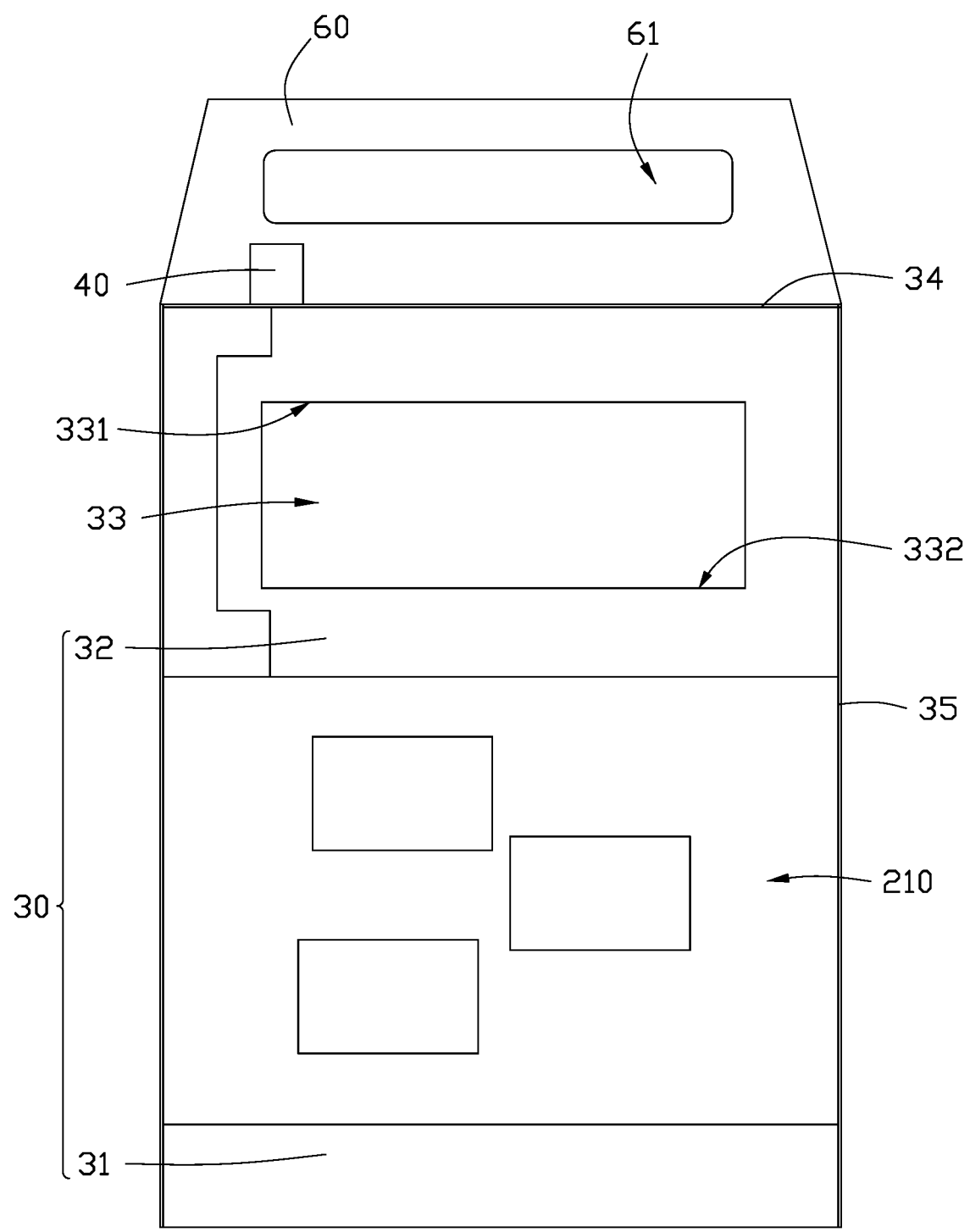
FIG. 3 is a perspective view of the support plate and the electronic device of FIG. 2.

Referring to FIG. 3, the immersion cooling device 100 includes a housing 10, a condenser 20, and a support plate 30. The housing 10 defines a chamber 11 for receiving a working liquid 12. The condenser 20 is received in the chamber 11 and located outside the working liquid 12. The support plate 30 is received in the chamber 11. The support plate 30 includes a first portion 31 and a second portion 32 connected to the first portion 31. The first portion 31 is immersed in the working liquid 12 and used to hold the electronic device 210. The second portion 32 protrudes from the working liquid 12. The second portion 32 defines a slot 33 extending through the second portion 32. An opening of the slot 33 faces the condenser 20. When the working liquid 12 absorbs the heat generated by the electronic device 210 and vaporizes, the vapor can directly reach the condenser 20 through the slot 33 without the need to bypass the top of the support plate 30 before reaching the condenser 20. Thus, the path of the vapor toward the condenser 20 is shortened, which improves the condensing efficiency of the vapor and thus improves the cooling efficiency.

In at least one embodiment, the housing 10 is substantially a hollow rectangular. The housing 10 is equipped with a platform 50, and the condenser 20 is disposed on the platform 50. The condenser 20 protrudes from the working liquid 12. After the working liquid 12 is heated and vaporizes, the vapor inside the housing 10 flows toward the condenser 20. The vapor directly condenses into liquid droplets when being in contact with the condenser 20, and then returns to the working liquid 12 again. Optionally, the platform 50 may be a block independently disposed in the housing 10 or a plate or block protruding from the inner wall of the housing 10. In at least one embodiment, the housing 10 may also include a cover (not shown) for sealing the chamber 11. The working liquid 12 may be an insulating coolant.

In at least one embodiment, the electronic device 210 is installed on a surface of the first portion 31 such as by welding, gluing, or screwing. The first portion 31 and the entire electronic device 210 are immersed in the working liquid 12.

In at least one embodiment, the slot 33 has a first inner wall 331 and a second inner wall 332. The first inner wall 331 and the second inner wall 332 are opposite to each other in a direction from the second portion 32 to the first portion 31. The first inner wall 331 is further away from the first portion 31 compared to the second inner wall 332. The first inner wall 331 is flush with the top surface of the condenser 20. The condenser 20 includes multiple condensing tubes (not shown) for cooling purpose, and the condensing tubes arranged side by side. Since the first inner wall 331 of the slot 33 is flush with the top surface of the condenser 20, the vapor in the chamber 11 can directly reach and accumulate on the condenser 20 through the slot 33, thereby reducing the diffusion of vapor towards the space above the condenser 20 and improving the cooling efficiency. Furthermore, the escape and loss of the vapor can also be avoided. In at least one embodiment, the second inner wall 332 is flush with the bottom surface of the condenser 20, thereby reducing the diffusion of vapor towards the space below the condenser 20 and improving the cooling efficiency. The slot 33 can match the surface of the condenser 20 facing the support plate 30 in shape, thereby allowing the vapor to fully accumulate on the condenser 20.

In at least one embodiment, the second portion 32 includes a baffle 34. The baffle 34 is located at the end of the second portion 32 away from the first portion 31. The baffle 34 can block some of the vapor that rises from the working liquid 12, so such vapor is limited between the baffle 34 and the working liquid 12. Such vapor then flows to the condenser 20 through the slot 33 and forms liquid droplets that return to the working liquid 12.

In at least one embodiment, the immersion cooling device 100 includes multiple support plates 30 arranged in columns, and the slots 33 of the multiple support plates 30 correspond to and communicate with each other. Each support plate 30 is equipped with one electronic device 210. The multiple support plates 30 may also arranged in rows according to actual needs.

In at least one embodiment, two side plates 35 are provided on both sides of the support plate 30. The two side plates 35 protrudes from a same surface of the support plate 30. The support plate 30 and the two side plates 35 cooperatively form a receiving cavity for receiving the electronic device 210. Each of the side plates 35 extends from the first portion 31 to the second portion 32. When the multiple support plates 30 are also arranged in rows, one side plate 35 of one support plate 30 is abutted against one side plate 35 of an adjacent support plate 30. Thus, more vapor can accumulate in the receiving cavity and then reach the condenser 20 through the slot 33.

In at least one embodiment, an operation portion 60 is mounted on the baffle 34. A user can operate the operation portion 60, thus inserting the support plate 30 and the electronic device 210 installed on the support plate 30 into the working liquid 12. The user can also operate the operation portion 60, thus removing the support plate 30 and the electronic device 210 installed on the support plate 30 from the working liquid 12 for maintenance purpose. The operation portion 60 defines a through hole 61.

In at least one embodiment, a light emitting unit 40 is also mounted on the baffle 34 such as by gluing or screwing. The light emitting unit 40 is electrically connected to the electronic device 210, and can indicate different working status of the electronic device 210 by different colors or brightness. The light emitting unit 40 can be an LED lamp. Since the light emitting unit 40 is mounted on the baffle 34, the light from the light emitting unit 40 can be observed more clearly, and it is more conducive for maintenance purpose.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. An immersion cooling device comprising:
a housing defining a chamber;
a working liquid received in the chamber;
a condenser received in the chamber and located outside the working liquid; and
at least one support plate received in the chamber, wherein each of the at least one support plate comprises a first portion and a second portion connected to the first portion, the first portion is immersed in the working liquid and configured to hold an electronic device, the second portion protrudes from the working liquid, the second portion defines a slot extending through the second portion, and an opening of the slot faces the condenser;
wherein the slot has a first inner wall and a second inner wall, the first inner wall and the second inner wall are opposite to each other in a direction from the second portion to the first portion, the first inner wall to the first portion is farther than the first inner wall to the second inner wall, and the first inner wall is flush with a top surface of the condenser.

2. The immersion cooling device of claim 1, wherein the second inner wall is flush with a bottom surface of the condenser.

3. The immersion cooling device of claim 1, wherein the second portion comprises a baffle at an end of the second portion away from the first portion.

4. The immersion cooling device of claim 3, further comprising a light emitting unit mounted on the baffle, wherein the light emitting unit is configured to indicate a working status of the electronic device.

5. The immersion cooling device of claim 1, wherein the at least one support plate comprises a plurality of support plates arranged in columns, and the slot of each of the plurality of support plates corresponds to and communicates with the slot of adjacent one of the plurality of support plates.

6. The immersion cooling device of claim 5, further comprising two side plates connected to opposite sides of each of the plurality of support plates.

7. The immersion cooling device of claim 1, further comprising a platform for supporting the condenser.

8. The immersion cooling device of claim 1, further comprising an operation portion mounted on the second portion.

9. An electronic module comprising:
an electronic device; and
an immersion cooling device comprising:
a housing defining a chamber;
a working liquid received in the chamber;
a condenser received in the chamber and located outside the working liquid; and
at least one support plate received in the chamber, wherein each of the at least one support plate comprises a first portion and a second portion connected to the first portion, the first portion is immersed in the working liquid and configured to hold the electronic device, the second portion protrudes from the working liquid, the second portion defines a slot extending through the second portion, and an opening of the slot faces the condenser;
wherein the slot has a first inner wall and a second inner wall, the first inner wall and the second inner wall are opposite to each other in a direction from the second portion to the first portion, the first inner wall to the first portion is farther than the inner wall to the second inner wall, and the first inner wall is flush with a top surface of the condenser.

10. The electronic module of claim 9, wherein the second inner wall is flush with a bottom surface of the condenser.

11. The electronic module of claim 9, wherein the second portion comprises a baffle at an end of the second portion away from the first portion.

12. The electronic module of claim 11, wherein the immersion cooling device further comprises a light emitting unit mounted on the baffle, and the light emitting unit is configured to indicate a working status of the electronic device.

13. The electronic module of claim 9, wherein the at least one support plate comprises a plurality of support plates arranged in columns, and the slot of each of the plurality of support plates corresponds to and communicates with the slot of adjacent one of the plurality of support plates.

14. The electronic module of claim 13, wherein the immersion cooling device further comprises two side plates connected to opposite sides of each of the plurality of support plates.

15. The electronic module of claim 9, wherein the immersion cooling device further comprises a platform for supporting the condenser.

16. The electronic module of claim 9, wherein the immersion cooling device further comprises an operation portion mounted on the second portion.

* * * * *